(12) United States Patent
Hall et al.

(10) Patent No.: US 6,313,664 B1
(45) Date of Patent: Nov. 6, 2001

(54) LOAD CAPACITANCE COMPENSATED BUFFER, APPARATUS AND METHOD THEREOF

(75) Inventors: Geoffrey B. Hall; Pedro Ovalle; Dzung T. Tran, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/528,857

(22) Filed: Mar. 20, 2000

(51) Int. Cl.$^7$ ............................................. H03K 19/0185
(52) U.S. Cl. ................... 326/83; 326/86; 326/87; 326/27; 326/26
(58) Field of Search .................... 326/83, 86, 87, 326/26, 27; 327/108, 109, 170

(56) References Cited

U.S. PATENT DOCUMENTS

| | | | |
|---|---|---|---|
| 5,619,147 | 4/1997 | Hunley | 326/26 |
| 5,909,402 * | 6/1999 | Joo | 365/189.07 |
| 5,949,259 * | 9/1999 | Garcia | 327/111 |
| 5,986,489 * | 11/1999 | Raza et al. | 327/170 |
| 6,118,324 * | 9/2000 | Li et al. | 327/384 |
| 6,181,156 * | 1/2001 | Durham et al. | 326/27 |
| 6,184,703 * | 2/2001 | Vest et al. | 326/27 |

\* cited by examiner

*Primary Examiner*—Michael Tokar
*Assistant Examiner*—Vibol Tan

(57) ABSTRACT

A primary driver is activated to drive an output signal in response to an input signal. A reference signal is generated in response to the input signal. The output signal is compared to the reference signal. When the output signal lags the reference signal by a predefined amount an auxiliary driver is activated.

26 Claims, 9 Drawing Sheets

LOAD CAPACITANCE COMPENSATED BUFFER, APPARATUS AND METHOD THEREOF

BACKGROUND

1. Field of the Invention

The present invention relates generally to output buffers, and more specifically to load capacitance compensating output buffers.

2. Description of the Related Art

It is known in the semiconductor industry to limit the transient effects of signals by controlling the slew rates of these signals. Slew rates for an unregulated buffer will vary based upon load capacitance. Load dependence of slew rate can be controlled by using a feedback path from the driver output to control the input of the driver and by using layout techniques such as snaked gates. Transient effects, such as transmission line effect reflections, cross talk between nodes, and overshoot/ringing, are reduced by using feedback to control the slew rate of individual output nodes.

For example, slew rates may be controlled by connecting a capacitor between a controlling voltage and an output signal of an output stage. The capacitor is used to provide feedback which is necessary to moderate the output transient. One disadvantage associated with an output stage of this type of circuit is that large capacitors are required to drive an output pull-up and/or pull-down gate while overcoming the drive current of the pre-driver. In order to assure that the drive current of the pre-driver can be balanced in a manner that is immune or resistant to process variations, a series precision resistor which typically requires special processing can be used.

Another slew rate control implementation uses switched differential amplifiers to compare the output signal to a signal generated by a transistor pulling one terminal of a reference capacitor. Such an implementation utilizes a single driver having its output based upon the relationship of the output signal of the driver and the signal associated with the reference capacitor. Because one leg of the amplifier from each differential pair will directly drive a final output transistor of a pull-up or pull-down driver, large switched amplifiers are often needed. Such large switched amplifiers have the disadvantage of low speed.

Conventional slew rate controllers respond to a signal transition at a predetermined value of the time derivative of voltage (dV/dt) and act to limit dV/dt thereafter. However, while such slew rate controllers typically affect the slew rate by controlling dV/dt, such slew rate controllers do little to directly control the time derivative of current (dI/dt). Typically, the initial component of dI/dt waveforms for different loads are substantially identical and take the form of a pulse which has already occurred by the time conventional slew rate controllers respond to dV/dt. Thus, although dV/dt is controlled by conventional solutions, the initial pulse in dI/dt is substantially unaffected because the increase in dI/dt precedes the increase in the magnitude of dV/dt.

The similarity of the initial dI/dt components indicates that they are substantially independent of the loading, unlike dV/dt which is load dependent. During a signal transition at a buffer, a dV/dt waveform for a relatively large load (e.g., 30 pF in one embodiment) will typically vary smoothly from zero V/S to a maximum magnitude and back to zero, whereas a dV/dt waveform for a relatively small load (e.g., 5 pF in one embodiment) will typically increase in magnitude more sharply because of the smaller capacitance. In contrast, the initial dI/dt is chiefly a function of the current drive of the output transistor and the rate at which the controlling voltage of the output transistor crosses the turn-on threshold. The dI/dt during a signal transition for each of a set of conventional drivers on an integrated circuit typically peaks at substantially the same instant in time and is of a magnitude that is substantially load independent. Thus, when a number of drivers are switched simultaneously, the total initial dI/dt generated is the sum of the initial dI/dt for each of the drivers. This total dI/dt is often the key factor responsible for electromagnetic interference (EMI) and other undesirable transient effects.

Other disadvantages of the prior art include the need for special processes to fabricate the drivers in semiconductors. For example, depending upon the transistor sizes needed, double poly processes, or processes capable of providing precision resistors are preferable.

Therefore, it would be beneficial to have a load capacitance output buffer that controls dV/dt and dI/dt in a baseline process.

BRIEF DESCRIPTION OF THE DRAWINGS

The embodiments of the present invention discussed hereinafter may be better understood by referencing the accompanying drawings.

DETAILED DESCRIPTION

Figure 1:
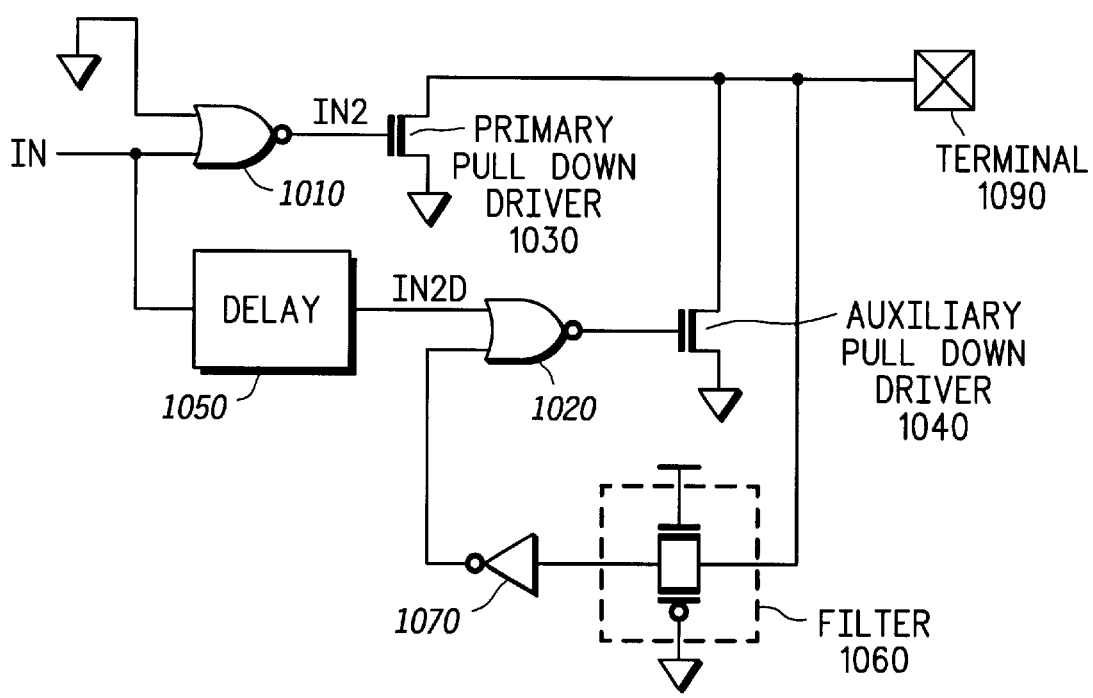
FIG. 1 illustrates, in schematic and block form, an embodiment of a portion of a driver in accordance with the present invention.

The following is intended to provide a detailed description of at least one example of the invention and should not be taken to be limiting of the invention. Rather, any number of variations may fall within the scope of the invention which is properly defined in the claims following this description.

A primary driver is activated to drive an output signal in response to an input signal. A reference signal is generated in response to the input signal. The output signal is compared to the reference signal. When the output signal lags the reference signal by a predefined amount, an auxiliary driver is activated.

In one embodiment, an apparatus such as an integrated circuit, microprocessor, wireless communications device, computer system, etc., includes a driver circuit for driving an output signal on an output terminal. The output signal corresponds to an input signal received at an input of the driver circuit. The driver circuit includes primary and auxiliary drivers, and a slew rate control circuit. The primary driver is coupled to the driver circuit input and the output terminal. The slew rate control is circuit coupled to the driver circuit input. The auxiliary driver is coupled to the slew rate control circuit and the output terminal. The slew rate control circuit controls activation of the auxiliary driver. For example, the slew rate control circuit may include circuitry to activate the auxiliary driver after activation of the primary driver (e.g., depending on a comparison of a reference signal and the output signal, for further example, wherein the reference signal differs from the output signal by at least a signal magnitude and/or time lag threshold). The slew rate control circuit may further include circuitry for augmenting the transition of the output signal to a degree depending upon a magnitude of difference between the output signal and the reference signal. The slew rate control circuit may further include circuitry for determining (e.g., advancing or delaying) the deactivation time of the auxiliary driver.

In another embodiment, an apparatus includes primary and secondary drivers and a voltage change measurement circuit. The voltage change measurement circuit is coupled to provide a control signal depending upon a change in voltage with respect to time of an output of the primary driver. The secondary driver is coupled to the voltage change measurement circuit and the primary driver, the secondary driver being activated depending on the control signal.

In another embodiment, a method of driving an output signal using auxiliary drive capability when required includes the following operations: activating a primary driver to drive an output signal responsive to receiving an input signal; generating a reference signal responsive to receiving the input signal; comparing the output signal with the reference signal; and activating an auxiliary driver if the output signal lags the reference signal by a lag threshold.

In another embodiment, a method of driving an output signal using conditional auxiliary drive capability includes the following operations: initiating driving a transition of an output signal responsive to receiving an input signal by a primary driver; and augmenting driving the transition of the output signal by an auxiliary driver responsive to the output signal.

Figure 2:
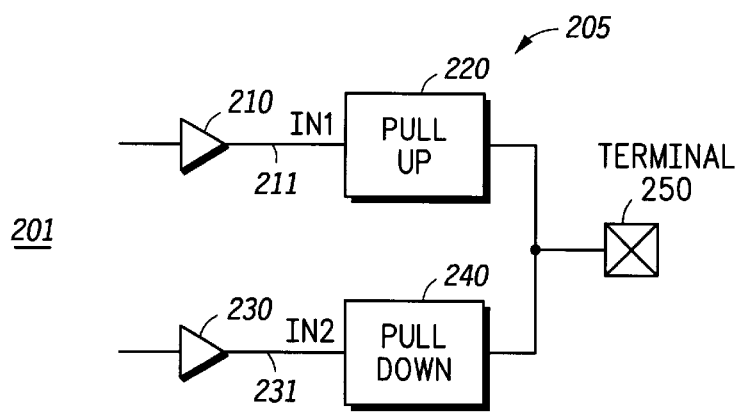
FIG. 2 illustrates, in block form, a driver in accordance with the present invention.

FIG. 2 illustrates a system 201 comprising a load capacitance compensated buffer 205 in accordance with the present invention. The system 201 can be a discrete buffer component, a portion of a microprocessor, or a portion of computer system incorporating such a buffer. The illustrated embodiment of the buffer 205 includes pre-drivers 210 and 230, pull-up driver 220, pull-down driver 240, and terminal 250.

When buffer 205 is enabled for output to terminal 250, the pre-drivers 210 and 230 will be configured to receive a common signal or similar signals (not illustrated) and provide signals labeled IN1 and IN2 on nodes 211 and 231 respectively. The IN1 signal is received by pull-up driver 220, which in turn drives terminal 250. The IN2 signal is received by pull-down driver 240, which in turn drives terminal 250.

The pre-drivers 210 and 230 are used to condition the common signal for use by drivers 220 and 240 respectively. Included in the pre-driver conditioning is timing control, to assure the pull-up and pull-down drivers 220 and 240 are not simultaneously activated, and conditioning of the voltage and current levels of the signals IN1 and IN2 to assure proper interface with the components internal to the drivers 220 and 240.

The pull-up driver 220 controls slew rate (dV/dt) and dI/dt of a signal at terminal 250 during a pull-up transition. The pull-up driver 220 includes a primary driver and an auxiliary driver. The primary driver provides an initial dI/dt having relatively stable peak magnitude relative to loading at the terminal 250. The auxiliary driver provides an initial dI/dt having a peak in magnitude delayed from the peak of the dI/dt of the primary driver (see, e.g., positive portions of waveforms in FIG. 6), however, the initial dI/dt peak of the auxiliary driver may vary based upon the capacitance of the load at terminal 250. In a similar manner, the pull-down driver 240 provides a primary and auxiliary driver.

By providing multiple drivers as part of, for example, each of the pull-up driver 220 and pull-down driver 240, the initial dI/dt is partitioned over time based upon capacitive loading and the magnitude of dI/dt varies based on the load. Therefore, the peak of the initial dI/dt for each buffer is reduced. Also, when a number of I/O drivers are switched simultaneously on an integrated circuit, the magnitude of the total initial dI/dt of the integrated circuit is reduced as compared to the total initial dI/dt of conventional circuits.

Figure 3:
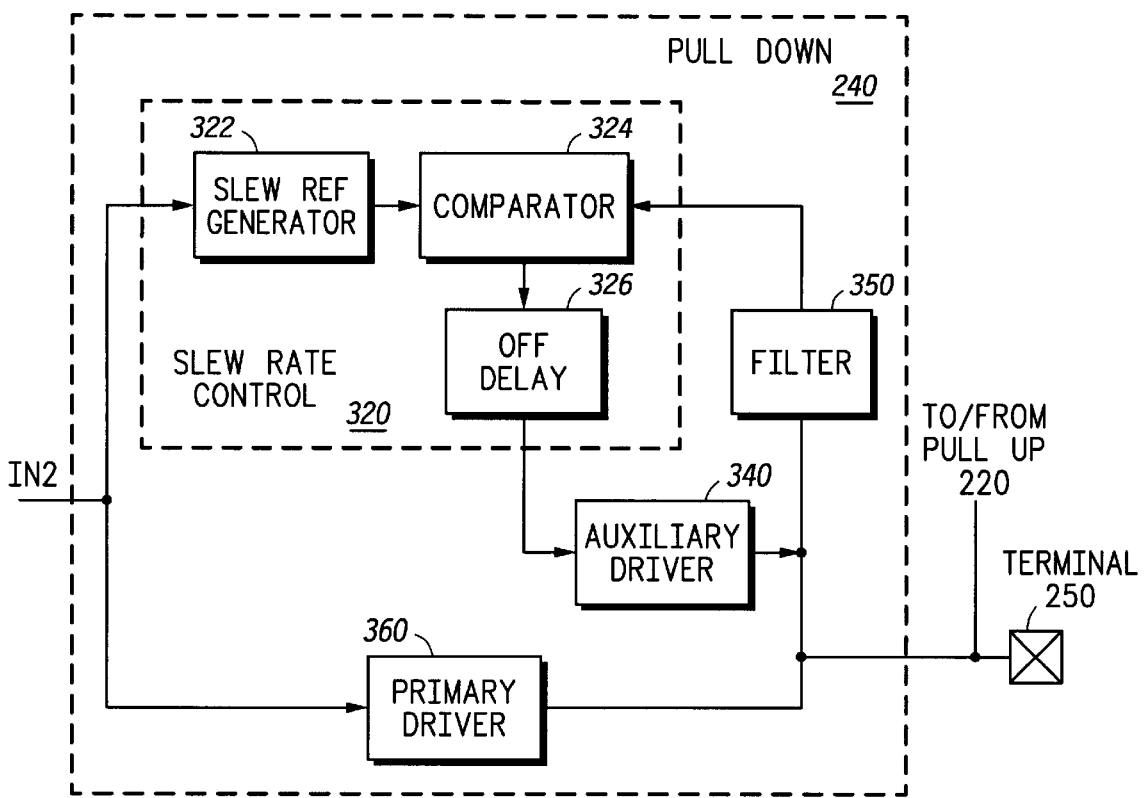
FIG. 3 illustrates, in block form, a portion of the driver of FIG. 2 in greater detail.

FIG. 3 illustrates a more detailed view of the pull-down driver 240 of FIG. 2. Pull-down driver 240 includes slew rate control 320, optional filter 350, auxiliary driver 340, and primary driver 360. In addition, FIG. 3 illustrates the terminal 250, which is driven by the pull-down driver 240. One skilled in the art will recognize that a corresponding pull-up driver 220 may exist having similar and/or complementary components and functions to those illustrated in FIG. 3 and discussed herein.

The terminal 250 is driven by the primary driver 360 and the auxiliary driver 340. The primary driver 360 receives the IN2 signal from the pre-driver. In response, the primary driver 360 drives the terminal 250. The slew rate control 320 receives the signal IN2, and a representation of the output terminal 250. Based upon these two signals, the slew rate control 320 provides a control signal to the auxiliary driver 340, which in turn also drives the terminal 250. The signal at terminal 250 is received by the optional filter 350 which conditions the output signal for use by the slew rate control 320.

In addition to controlling the primary driver 360, the signal IN2 is used to generate a slew reference signal that is an idealized representation of the output signal due to the primary driver 360. An idealized representation of the output signal due to primary driver 360 refers to a time varying reference signal generated by the slew reference generator 322 based upon the signal IN2, which also controls the primary driver 360. Furthermore, the representation is considered idealized because it is not subject to load variations. Based upon the slew reference signal and the signal from the output terminal 250, the slew rate control 320 controls whether or not the auxiliary driver is to be activated.

Generally, the auxiliary driver is activated if the output signal voltage lags by some predefined difference amount or "delta" which can be fixed. If so, it is an indication that the slew rate of the output signal at the terminal 250 can benefit from additional drive. Therefore, a control signal is generated by slew rate control 320 to drive the gate of the auxiliary driver, thereby augmenting the preliminary driver 360.

In addition to the slew reference generator 322, the slew rate control 320 includes an off delay portion 326, and a comparator 324. The comparator 324 receives a representation of the output signal from terminal 250, which may be filtered by an optional filter 350, and a slew reference signal from the slew reference generator 322. When the signal received from terminal 250 is a threshold voltage or greater above the voltage of the slew reference signal, a control signal drives the auxiliary driver through the off delay portion 326. The off delay 326 extends, or holds, the control signal of the auxiliary driver asserted after the comparator stops driving it.

The combination of slew reference generator 322 and comparator 324 delay generation of the control signal as compared to the slew reference signal. In one implementation, the delay is the result of a threshold voltage associated with comparator 326. In another implementation the delay can be generated prior to the comparator 324, for example, by the slew reference generator. The amount of delay generated defines how much time separation exists between the initial dI/dt spikes of the primary and auxiliary output drivers. This helps to reduce the magnitude of the total dI/dt through the combined sources of the primary and auxiliary output transistors.

Figure 5:
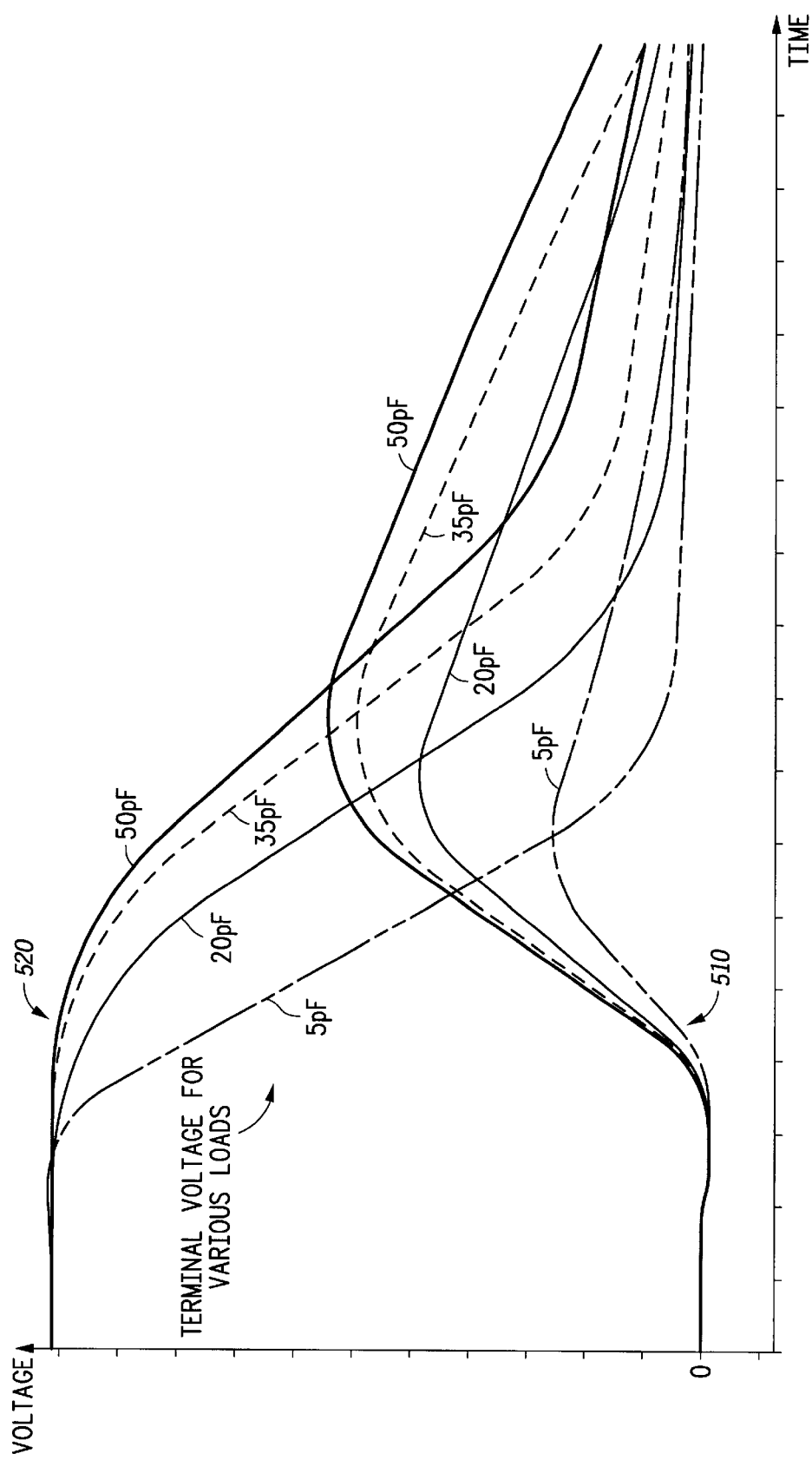
FIGS. 5, 6, and 8 illustrate, in graphical form, curves associated with the voltage, the current and the time derivative of current in accordance with an embodiment the present invention.

FIG. 5 illustrates curves representing the voltage at terminal 250 and the control signal voltage at the auxiliary driver 340 for various capacitance values. Specifically, curves 520 represent voltage at terminal 250 for loads of 5 pF, 20 pF, 35 pF, and 50 pF. The curves 510 represent the voltage of the signals driving the gate of the auxiliary driver 340 for the various load capacitances. The curves 510 illustrate that for lower capacitance loads, the gate of the auxiliary driver 340 is not asserted as fully as for higher capacitance loads. Once the auxiliary driver gate begins to transition, the terminal voltage represented by curves 520 is modified by the auxiliary driver. As can be seen in FIG. 5, the slope of each curve in group 520 is substantially similar, indicating similar slew rates.

Figure 6:
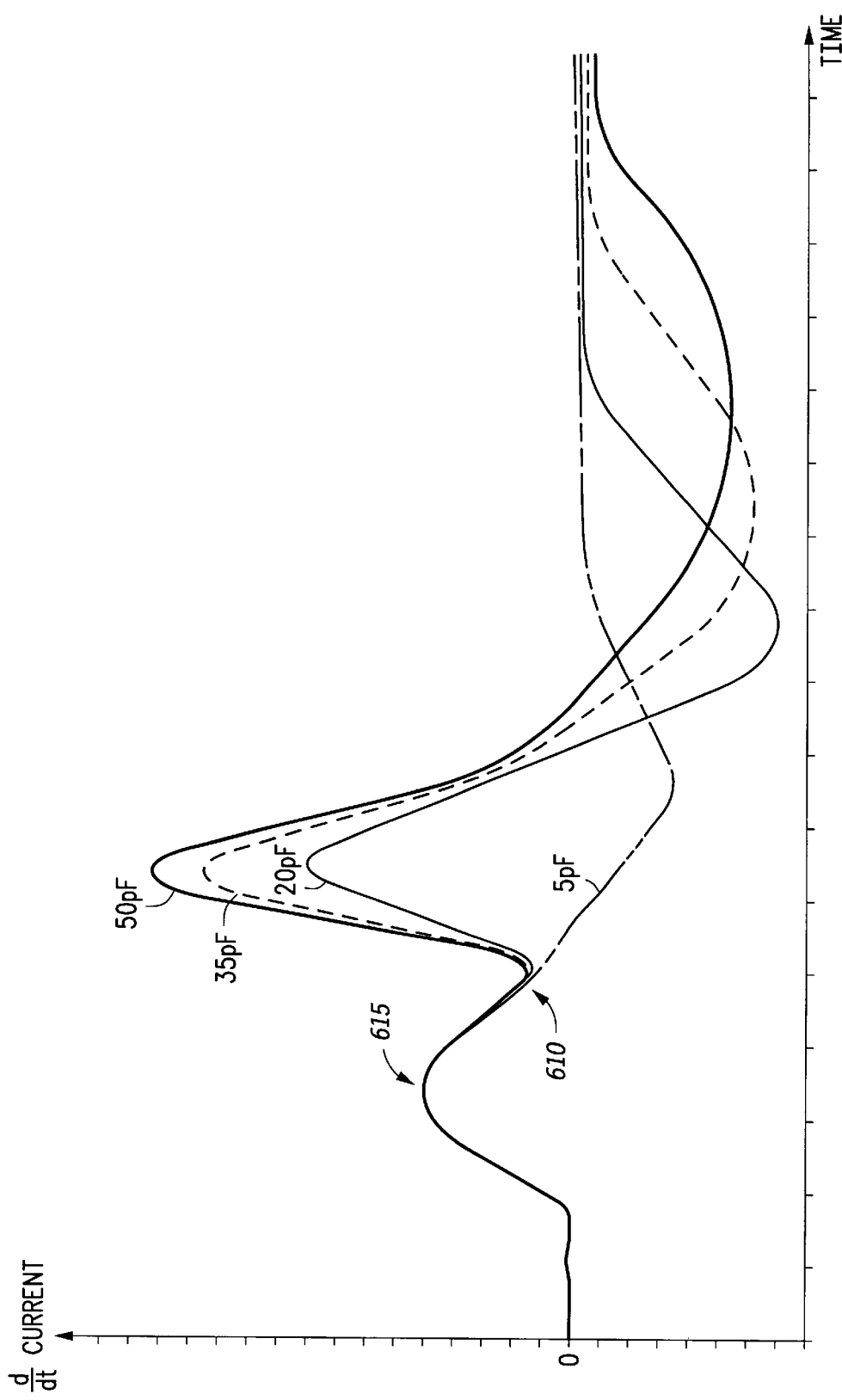
Figure 8:
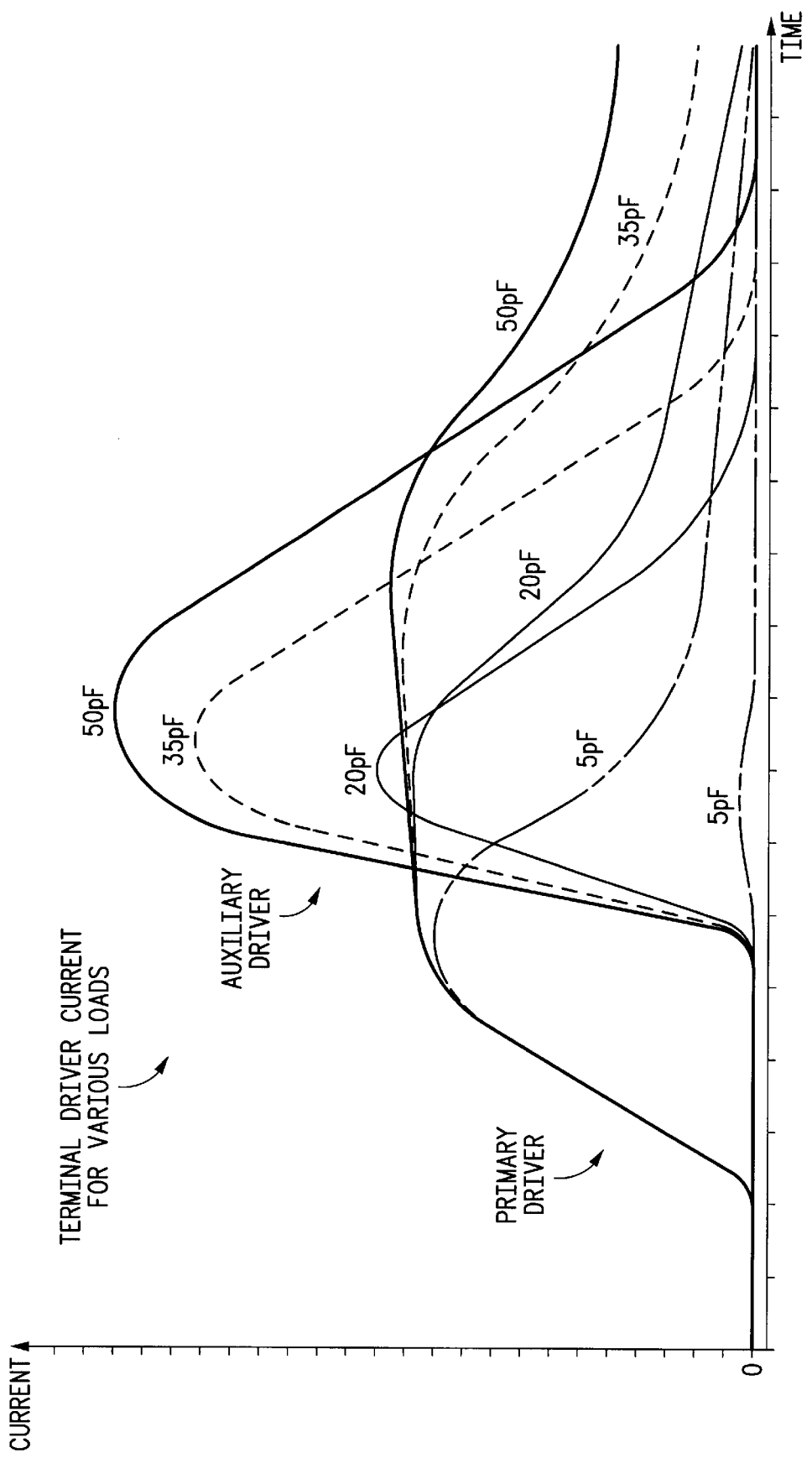

FIG. 6 illustrates curves representing dI/dt of the signal at terminal 250. The dI/dt curves are associated with the curves 520 of FIG. 5. (Note that the current curves from which FIG. 6 is derived are included as FIG. 8, and are not discussed in greater detail herein.) Curves 610 have a substantially similar dI/dt magnitude at location 615 which is the initial dI/dt of the primary driver 360. The initial dI/dt curve of the primary driver does not vary significantly based upon the capacitance of the load. However, the initial dI/dt component associated with the auxiliary driver 340 does vary based upon the capacitance of the load.

The initial dI/dt of the auxiliary driver is offset from the dI/dt component of the primary driver (e.g., by approximately 1 ns). This is the delay influenced by the slew reference generator 322 and comparator 324. Also, the initial dI/dt magnitude of the auxiliary driver depends upon the load capacitance at terminal 250. For example, for a 50 pF load, the initial dI/dt component attributable to the auxiliary driver 340 has been observed to be approximately 28 MA/s (mega-amperes per second); for a 35 pF load the initial dI/dt component attributable to the auxiliary driver 340 has been observed to be approximately 20 MA/s; for a 20 pF load the initial dI/dt of the auxiliary driver 340 has been observed to be approximately 18 MA/s; and for a 5 pF load, the initial dI/dt component has been observed to be negligible as compared to the components provided by the primary driver 360.

Delaying generation of the auxiliary driver current is advantageous because it allows the total dI/dt associated with the driver 240 to be distributed over a longer period of time, thereby reducing the magnitude of dI/dt. In addition, allowing the initial dI/dt of the auxiliary driver to vary with capacitance prevents overdriving. This is advantageous over some conventional designs which drive all output terminals with a dI/dt characteristic based upon a maximum expected load and maximum allowed propagation delay. Such designs thus fail to regulate the EMI associated with dI/dt.

Figure 4:
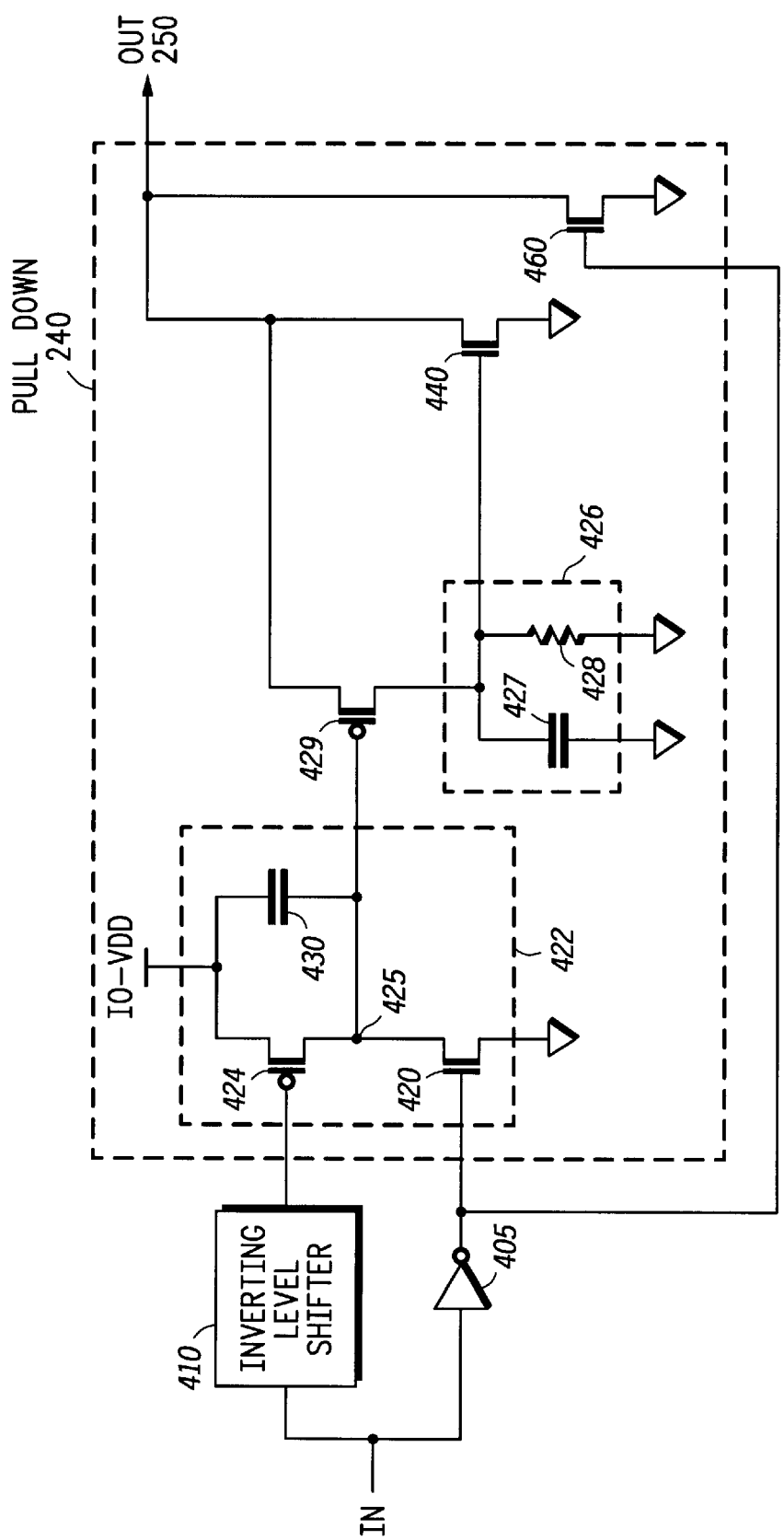
FIG. 4 illustrates, in schematic and block form, the portions of FIG. 2 and 3 in greater detail.
Figure 7:
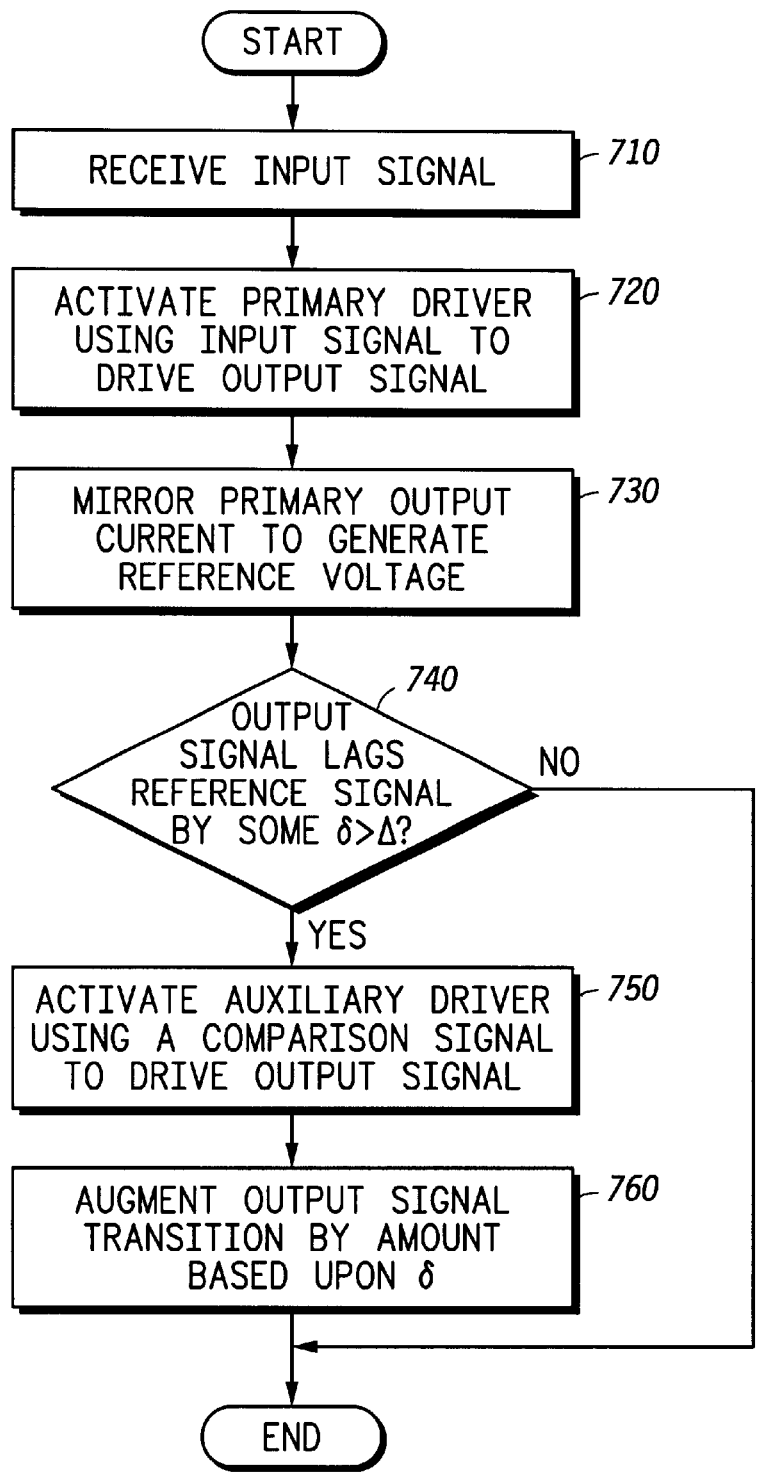
FIG. 7 illustrates, in flow diagram form, a method in accordance with the present inventions.

FIG. 4 illustrates one embodiment of the blocks of FIG. 3 in greater detail. Specifically, FIG. 4 includes circuit and block diagram components to illustrate a specific embodiment of FIG. 3. FIG. 7 illustrates a flow diagram for a method related to the functionality of the circuit described herein. The discussion of FIG. 4 will reference steps in FIG. 7.

In operation, the signal IN is received by an inverting level shifter 410 and a predriver 405. (See also step 710 of FIG. 7.) The pre-driver 230 of FIG. 2 is analogous to the pre-driver 405 in FIG. 4. The level shifter 410 is optional, and is generally used to provide an interface between a core positive supply voltage and a different, generally higher, positive supply voltage associated with the driver 240 (IO-VDD). In this example, the level shifter is used to assure the p-type MOSFET 424 can be completely turned off. The output of the pre-driver 405 drives the control electrode of n-type transistor 460 which is the primary driver (see step 720 of FIG. 7), and the control electrode of n-type transistor 420 of slew reference generator 422. Transistor 420 thus serves as a current mirror of transistor 460.

In the embodiment illustrated in FIG. 4, slew reference generator 422 is analogous to slew reference generator 322 of FIG. 3. Slew reference generator 422 includes an n-type transistor 420 which mirrors the primary driver transistor 460, a p-type transistor 424, and a capacitor 430. The mirror transistor 420 has a control electrode coupled to the pre-driver 405, a first current electrode, and a second current electrode coupled to a voltage reference of Vss. The p-type transistor 424 has a first current electrode coupled to a fixed voltage reference of the pull-down driver 240 (IO-VDD), a second current electrode coupled to the first current electrode of the transistor 420, and a control electrode coupled to the inverting level shifter 410. Capacitor 430 includes a first electrode coupled to IO-VDD, and a second electrode coupled to the first electrode of the transistor 420.

In operation, the transistor 420 of slew reference generator 422 provides a current that mirrors the primary transistor 460. (See also step 730 of FIG. 7.) In one embodiment, transistor 420 is approximately one-tenth the gate width of the primary driver 460. The mirrored current causes a time varying signal to be generated at electrode 425.

The signal from the electrode 425 is provided to a control electrode of transistor 429 which acts as a comparator of the signal from the electrode 425 output by slew reference generator 422 and the signal at terminal 250. The transistor 429 has a first current electrode coupled to terminal 250, and a second current electrode coupled to provide a control signal.

The off delay portion 426 is analogous to the off delay 326 of FIG. 3, and includes capacitor 427 and resistive element 428. The capacitor 427 has a first electrode coupled to the second current electrode of the transistor 429, and a second electrode coupled to Vss. The resistive element 428 has a first electrode coupled the first electrode of the capacitor 427, and a second electrode coupled to Vss. In operation, the capacitor 427 of off delay 426 is charged when comparator transistor 429 is on. As a result, the control electrode of auxiliary driver 440 is driven for a predetermined amount of time after the transistor 429 has shut off.

Transistor 440 is analogous to the auxiliary driver 340 of FIG. 3. Transistor 440 has a first current electrode coupled to the terminal 250, a second current electrode coupled to Vss, and a control electrode coupled to the first node of the capacitor 427. In operation, the transistor 429 operates as a voltage difference measurement circuit that determines when the voltage delta ($\delta$) between the voltage of the terminal 250 and the voltage of the slew reference signal at node 425 is greater than a predetermined DELTA ($\Delta$). For the specific embodiment illustrated, DELTA is equal to the threshold voltage of transistor 429. (See also step 740 of FIG. 7.) Therefore, when delta ($\delta$) is greater than the threshold voltage DELTA ($\Delta$), the transistor 429 turns on causing the auxiliary transistor 440 to actively drive the terminal 250. (See step 750 of FIG. 7.) The output signal from transistor 429 is delayed from the slew reference signal received at its gate based upon the threshold voltage of transistor 429. Once activated, transistor 429 causes the current drive of the output signal to be augmented. (See step 760 of FIG. 7).

Note that the resistive element 428 will generally be selected to be an active device. By using an active device, variations in process, temperature, and voltages, can be minimized, in that the active device can be chosen to generally track the variances associated with the auxiliary driver 440. As a result, it is possible for relatively uniform current performance to be maintained across the various process and operating conditions. Furthermore, by using active devices for the element 428, special processes for manufacturing high precision resistors are not necessary.

Figure 9:
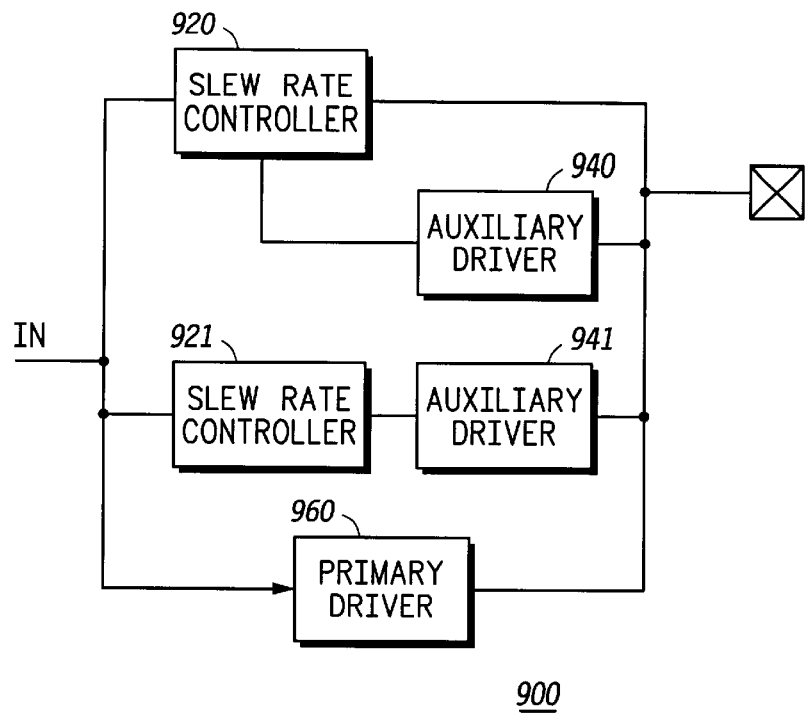
FIG. 9 illustrates, in block diagram form, an alternate embodiment of driver in accordance with the present invention.

FIG. 9 illustrates an alternate embodiment of the present invention, whereby multiple auxiliary drivers 940 and 941 are used. Such an implementation allows the EMI and other effects of dI/dt to be further controlled and diminished. For example, by further delaying the generation of the driver current to allow the total dI/dt associated with the driver to be distributed over a longer period of time, the magnitude of dI/dt is thereby reduced.

FIG. 1 illustrates another embodiment of the present invention in which a primary driver is activated to drive an output signal in response to an input signal, and an auxiliary driver is activated to drive the output signal in response to a similar but phase shifted (e.g., delayed) representation of the input signal. Although the auxiliary driver receives the delayed signal in the presently discussed embodiment, the primary driver may receive the delayed signal in another embodiment. When the output signal is pulled to a predefined threshold, the auxiliary driver is deactivated. In the embodiment of FIG. 1, the IO-VDD and core VDD are substantially the same positive supply voltage.

In operation, the signal IN is received by a pre-driver 1010. The output of the pre-driver 1010 drives the control electrode of the primary pull-down driver 1030. Delay circuit 1050 produces IN2D, a representation of the IN signal delayed with respect to IN by a predetermined time interval. The signal IN2D is in turn received by auxiliary pre-driver 1020. The output of the auxiliary pre-driver 1020 drives the control electrode of the auxiliary pull-down driver 1040. The pre-driver 405 in FIG. 4 is analogous to pre-driver 1010 in FIG. 1. The primary pull-down driver 460 in FIG. 4 is analogous to primary pull-down driver 1030 in FIG. 1. Slew reference generator 422 and comparator 429 in FIG. 4. are replaced in this embodiment by delay portion 1050, and the p-type transistors in the pre-driver 1020 in FIG. 1. Off delay portion 426 in FIG. 4 is replaced in this embodiment by inverter 1070 and the n-type transistors in the pre-driver 1020 in FIG. 1.

In this embodiment, the input of an inverter 1070 receives a representation of the output signal from terminal 1090, which may be filtered by an optional filter 1060. In this example, the n-type and p-type transistors in the inverter 1070 are sized such that the trip point of the inverter 1070 is approximately a p-MOSFET threshold below VDD. Thus, when the output terminal 1090 is pulled to a threshold or greater below VDD, the output of the inverter 1070 deactivates auxiliary pre-driver 1020, which in turn deactivates the auxiliary pull-down driver 1040.

The turning off of the auxiliary pull-down driver 1040 occurs some total feedback delay after primary pull-down driver 1030 begins pulling the output terminal 1090. This total feedback delay may be described, for convenience, as consisting of a first delay and a second delay. The first delay is an output slew delay attributable to the pulling of the output terminal 1090 to a threshold below VDD. A second delay is a signal propagation delay through the inverter 1070 and the auxiliary pre-driver 1020. In one embodiment, the output slew delay is substantial compared to the propagation delay through the inverter 1070 and the auxiliary pre-driver 1020. Thus, the duty time of auxiliary pulldown driver 1040 varies based substantially upon the output slew delay, which varies based upon the load on terminal 1090.

Figure 10:
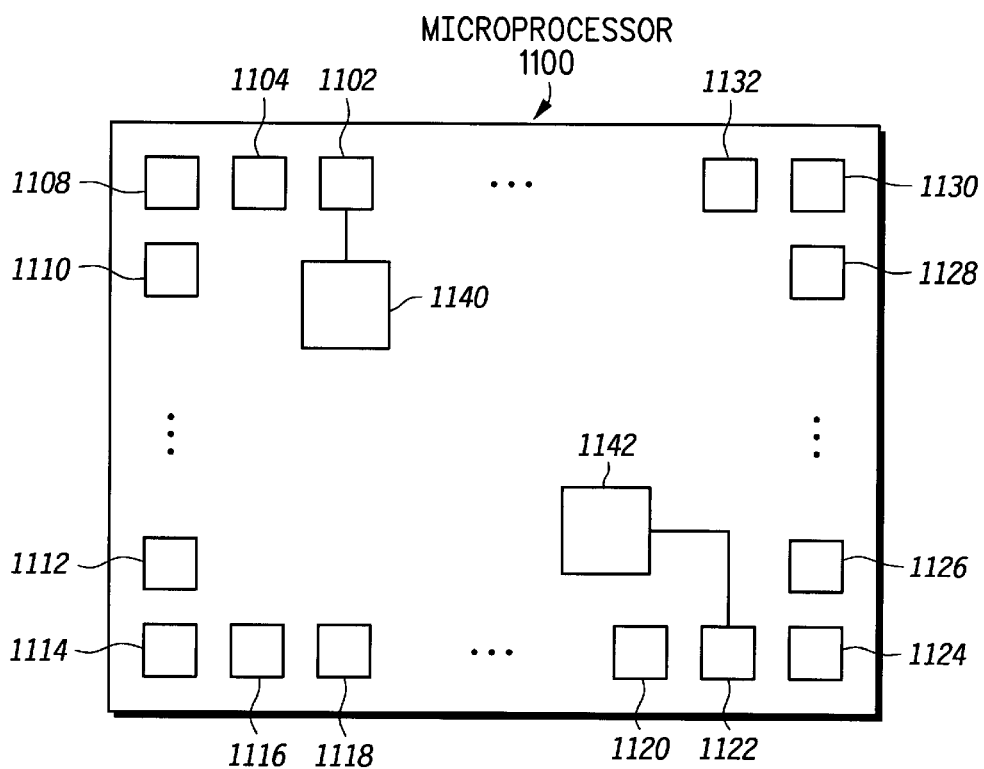
FIG. 10 illustrates, in block diagram form, a microprocessor in accordance with one embodiment of the present invention.

Illustrated in FIG. 10 is a microprocessor 1100 having microprocessor pins 1102, 1104, 1108, 1110, 1112, 1114, 1116, 1118, 1120, 1122, 1124, 1126, 1128, 1130, and 1132 according to one embodiment of the present invention. Microprocessor 1100 includes a plurality of driver circuits 1140 and 1142, where each of the plurality of driver circuits 1140 and 1142 corresponds to each of a plurality of microprocessor pins 1102 and 1122. Each primary driver of the plurality of driver circuits is conditionally augmented on a pin-by-pin basis by each auxiliary driver of the plurality of driver circuits.

Figure 11:
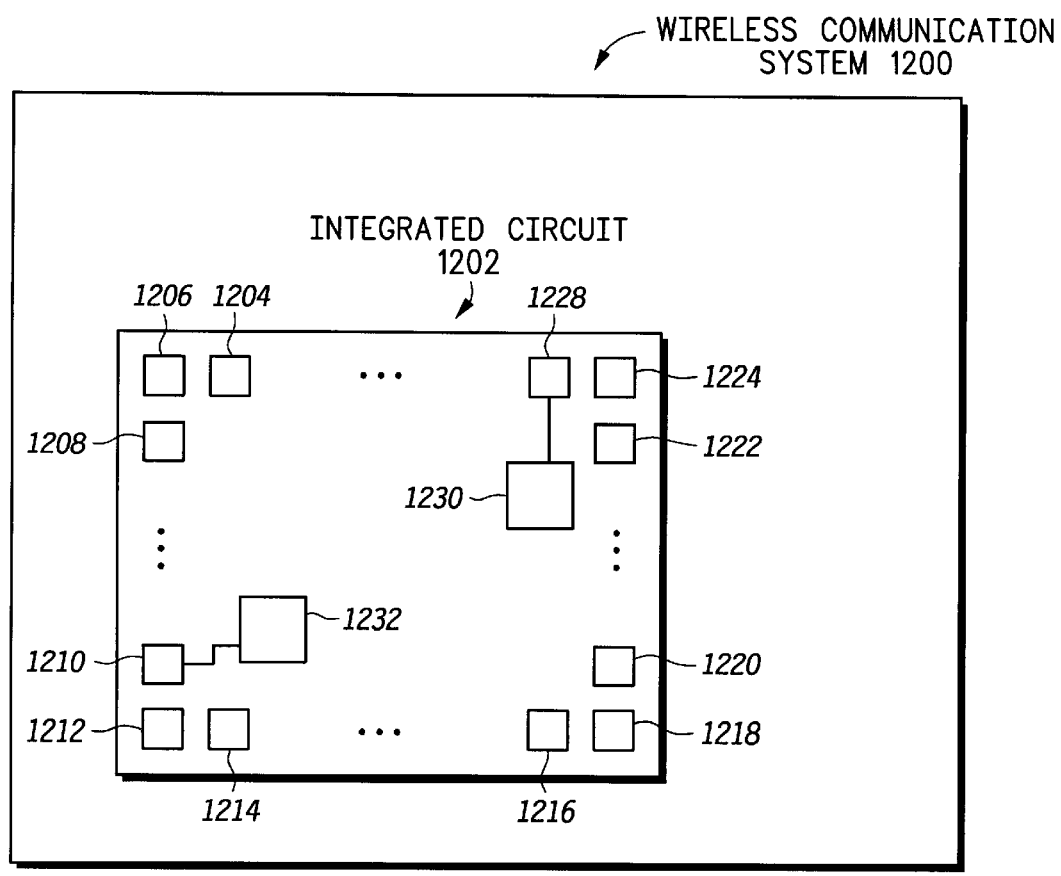
FIG. 11 illustrates, in block diagram form, a wireless communication system in accordance with one embodiment of the present invention.

Illustrated in FIG. 11 is a wireless communication system 1200 which includes an integrated circuit 1202 having integrated circuit pins 1204, 1206, 1208, 1210, 1212, 1214, 1216, 1218, 1220, 1222, 1224, 1228 according to one embodiment of the present invention. Integrated circuit 1202 includes a plurality of driver circuits 1232 and 1230, where each of the plurality of driver circuits 1232 and 1230 corresponds to each of a plurality of integrated circuit pins 1210 and 1228. Each primary driver of the plurality of driver circuits is conditionally augmented on a pin-by-pin basis by each auxiliary driver of the plurality of driver circuits.

One of ordinary skill in the art will recognize that variations to the present invention are readily implemented. For example, one skilled in the art will readily recognize that the circuit of FIG. 3 is readily modified to provide the pull-up driver analogous to the pull-down driver discussed.

In addition, the resistive and capacitive elements may be active devices. Furthermore, other implementation using transistors of different types than those described herein (whether bipolar, field effect, etc.) may be utilized to implement other embodiments of the present invention. Furthermore, while the invention has been described using transistors having a control electrode and current electrodes, other terms such as control and current terminals, current handling terminals, current nodes, and the like can be used. Furthermore, while the invention has been described using field effect transistors (FETs), it should be noted that insulated gate FETs (IGFETs) are commonly referred to as MOSFET devices (which literally is an acronym for "Metal-Oxide-Semiconductor Field Effect Transistor"), even though the gate material may be polysilicon or some material other than metal, and the dielectric may be oxynitride, nitride, or some material other than an oxide. The use of such historical legacy terms as MOSFET should not be interpreted to literally specify a metal gate FET having an oxide dielectric unless the context indicates that such a restriction is intended.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." As used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended, such an intent will be explicitly recited in the claim, and in the absence of such recitation no such limitation is present or intended. For example, in the claims below, when a claim element is described as having "one" feature, it is intended that that element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that that element not be limited to one and only one of the feature described. Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

The above description is intended to describe at least one embodiment of the invention. The above description is not intended to define the scope of the invention. Rather, the scope of the invention is defined in the claims below. Thus, while particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. An apparatus comprising a driver circuit for driving an output signal on an output terminal corresponding to an input signal received at a driver circuit input, the driver circuit comprising:
   a primary driver coupled to the driver circuit input and the output terminal;
   a slew rate control circuit coupled to receive the input signal and the output signal, wherein the slew rate control circuit further comprises:
      a comparator coupled to the driver circuit input and the output terminal to provide an on-delay for delaying activation of the auxiliary driver until after activation of the primary driver; and
   an auxiliary driver coupled to the slew rate control circuit and the output terminal, wherein the slew rate control circuit controls activation of the auxiliary driver.

2. The apparatus of claim 1, wherein the slew rate control circuit further comprises:
   off delay circuitry coupled to the comparator for delaying deactivating of the auxiliary driver.

3. The apparatus of claim 1, wherein the comparator is a transistor having a first current handling terminal coupled to receive the output signal, a control terminal coupled to receive a reference signal, and a second current handling terminal coupled to provide a control signal for activating the auxiliary driver.

4. The apparatus of claim 1, wherein the slew rate control circuit comprises:
   a mirror driver coupled to the driver circuit input and coupled to the comparator to at least partially provide a reference signal, wherein the comparator is coupled to receive the reference signal and the output signal, and coupled to provide a control signal to activate the auxiliary driver depending on a comparison of the reference signal and the output signal.

5. The apparatus of claim 4, wherein the comparator provides the control signal to activate the auxiliary driver responsive to the reference signal differing from the output signal by at least a threshold.

6. The apparatus of claim 4, wherein the slew rate control circuit controls the auxiliary driver to augment transition of the output signal to a degree depending upon a magnitude of difference between the output signal and the reference signal.

7. The apparatus of claim 4, wherein
   the primary driver comprises a transistor having a first width; and
   the mirror driver comprises a transistor having a second width, the second width being less than the first width.

8. The apparatus of claim 7, wherein the second width is about one-tenth of the first width.

9. The apparatus of claim 1, the driver circuit further comprising:
   a pull-down driver circuit, the pull-down driver circuit including the primary driver, the slew rate control circuit and the auxiliary driver, wherein the slew rate control circuit controls activation of the auxiliary driver upon high-to-low transitions of the input signal; and a pull-up driver circuit, the pull-up driver circuit including
a pull-up primary driver coupled to the driver circuit input and the output terminal;
a pull-up slew rate control circuit coupled to the driver circuit input; and
a pull-up auxiliary driver coupled to the pull-up slew rate control circuit and the output terminal, wherein the pull-up slew rate control circuit controls activation of the pull-up auxiliary driver upon low-to-high transitions of the input signal.

10. The apparatus of claim 1, the driver circuit further comprising:
a second auxiliary driver coupled to the slew rate control circuit and the output terminal, wherein the slew rate control circuit controls activation of the second auxiliary driver.

11. The apparatus of claim 10, wherein the slew rate control circuit comprises:
first delay circuitry for activating the auxiliary driver after activation of the primary driver;
second delay circuitry for activating the second auxiliary driver after activation of the auxiliary driver.

12. The apparatus of claim 1 further comprising:
a filter coupled between the output terminal and the slew rate control circuit.

13. The apparatus of claim 1 further comprising:
a microprocessor, the microprocessor including a plurality of said driver circuit, each of said plurality of said driver circuit corresponding to each of a plurality of microprocessor pins, each primary driver of the plurality of driver circuits being conditionally augmented on a pin-by-pin basis by each auxiliary driver of the plurality of driver circuits.

14. The apparatus of claim 1 further comprising:
a wireless communication system, the wireless communication system including an integrated circuit, the integrated circuit including a plurality of said driver circuit, each of said plurality of said driver circuit corresponding to each of a plurality of integrated circuit pins, each primary driver of the plurality of driver circuits being conditionally augmented on a pin-by-pin basis by each auxiliary driver of the plurality of driver circuits.

15. An integrated circuit comprising a plurality of driver circuits, each of the plurality of driver circuit comprising:
a primary driver; and
a voltage change measurement circuit coupled to provide a control signal depending upon a change in voltage with respect to time of an output of the primary driver in reference to a reference signal, wherein the reference signal is generated in response to an input signal of the driver circuit; and
a secondary driver coupled to the voltage change measurement circuit and the primary driver, the secondary driver being activated depending on the control signal.

16. The integrated circuit of claim 15, wherein the secondary driver is controlled to augment the primary driver to an extent depending on the change in voltage with respect to time of the output of the primary driver.

17. A method of driving an output signal using auxiliary drive capability when required, the method comprising:
activating a primary driver to drive an output signal responsive to receiving an input signal;
generating a reference signal responsive to receiving the input signal;
comparing the output signal with the reference signal; and
activating an auxiliary driver if the output signal lags the reference signal by a lag threshold.

18. The method of claim 17 further comprising:
augmenting the transition of the output signal by the auxiliary driver upon activating the auxiliary driver, the transition of the output signal being augmented by an amount depending on the difference between the output signal and the reference signal.

19. An apparatus comprising a driver circuit for driving an output signal on an output terminal corresponding to an input signal received at a driver circuit input, the driver circuit comprising:
a primary driver coupled to the driver circuit input and the output terminal;
a slew rate control circuit coupled to receive the input signal and the output signal; and
an auxiliary driver coupled to the slew rate control circuit and the output terminal, wherein the slew rate control circuit controls activation of the auxiliary driver;
wherein:
one of the primary and auxiliary drivers is coupled to receive the input signal and the other of the primary and auxiliary drivers is coupled to receive a delayed input signal; and
the slew rate control circuit includes a feedback delay circuit coupled to provide a feedback signal to deactivate the auxiliary driver responsive to the output signal.

20. The apparatus of claim 19, the driver circuit further comprising:
a pull-down driver circuit, the pull-down driver circuit including the primary driver, the slew rate control circuit and the auxiliary driver, wherein the slew rate control circuit controls activation of the auxiliary driver upon high-to-low transitions of the input signal; and
a pull-up driver circuit, the pull-up driver circuit including
a pull-up primary driver coupled to the driver circuit input and the output terminal;
a pull-up slew rate control circuit coupled to the driver circuit input; and
a pull-up auxiliary driver coupled to the pull-up slew rate control circuit and the output terminal, wherein the pull-up slew rate control circuit controls activation of the pull-up auxiliary driver upon low-to-high transitions of the input signal.

21. The apparatus of claim 19, the driver circuit further comprising:
a second auxiliary driver coupled to the slew rate control circuit and the output terminal, wherein the slew rate control circuit controls activation of the second auxiliary driver.

22. The apparatus of claim 21, wherein the slew rate control circuit comprises:
first delay circuitry for activating the auxiliary driver after activation of the primary driver;
second delay circuitry for activating the second auxiliary driver after activation of the auxiliary driver.

23. The apparatus of claim 19 further comprising:
a filter coupled between the output terminal and the slew rate control circuit.

24. The apparatus of claim 19 further comprising:
a microprocessor, the microprocessor including a plurality of said driver circuit, each of said plurality of said driver circuit corresponding to each of a plurality of microprocessor pins, each primary driver of the plurality of driver circuits being conditionally augmented on a pin-by-pin basis by each auxiliary driver of the plurality of driver circuits.

25. The apparatus of claim 19 further comprising:

a wireless communication system, the wireless communication system including an integrated circuit, the integrated circuit including a plurality of said driver circuit, each of said plurality of said driver circuit corresponding to each of a plurality of integrated circuit pins, each primary driver of the plurality of driver circuits being conditionally augmented on a pin-by-pin basis by each auxiliary driver of the plurality of driver circuits.

26. An apparatus comprising a driver circuit for driving an output signal on an output terminal corresponding to an input signal received at a driver circuit input, the driver circuit comprising:

a primary driver coupled to the driver circuit input and the output terminal;

a slew rate control circuit coupled to receive the input signal and the output signal;

an auxiliary driver coupled to the slew rate control circuit and the output terminal, wherein the slew rate control circuit controls activation of the auxiliary driver;

a pull-down driver circuit, the pull-down driver circuit including the primary driver, the slew rate control circuit and the auxiliary driver, wherein the slew rate control circuit controls activation of the auxiliary driver upon high-to-low transitions of the input signal; and a pull-up driver circuit, the pull-up driver circuit including
a pull-up primary driver coupled to the driver circuit input and the output terminal;
a pull-up slew rate control circuit coupled to the driver circuit input; and
a pull-up auxiliary driver coupled to the pull-up slew rate control circuit and the output terminal, wherein the pull-up slew rate control circuit controls activation of the pull-up auxiliary driver upon low-to-high transitions of the input signal.

* * * * *